United States Patent
Babcock et al.

(10) Patent No.: US 6,465,830 B2
(45) Date of Patent: Oct. 15, 2002

(54) RF VOLTAGE CONTROLLED CAPACITOR ON THICK-FILM SOI

(75) Inventors: Jeffrey A. Babcock, Dallas, TX (US); Gregory E. Howard, Dallas, TX (US); Angelo Pinto, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/862,775

(22) Filed: May 21, 2001

(65) Prior Publication Data

US 2002/0008268 A1 Jan. 24, 2002

Related U.S. Application Data

(60) Provisional application No. 60/211,131, filed on Jun. 13, 2000.

(51) Int. Cl.$^7$ .............................................. H01L 31/119
(52) U.S. Cl. .................. 257/302; 257/272; 257/302; 257/312; 257/378
(58) Field of Search ................................ 257/272, 273, 257/300, 301, 302, 312, 378; 357/23, 34, 52; 438/238, 295, 381

(56) References Cited

U.S. PATENT DOCUMENTS

| | | | | |
|---|---|---|---|---|
| 3,829,881 A | * | 8/1974 | Kohashi | 257/290 |
| 4,800,415 A | * | 1/1989 | Simmons et al. | 257/107 |
| 5,717,241 A | * | 2/1998 | Malhi et al. | 257/273 |
| 5,863,823 A | * | 1/1999 | Burgener | 438/295 |
| 5,965,912 A | | 10/1999 | Stolfa et al. | 257/312 |
| 5,973,382 A | | 10/1999 | Burgener et al. | 257/532 |
| 5,982,608 A | | 11/1999 | Kalnitsky et al. | 361/288 |
| 5,986,864 A | | 11/1999 | Davis | 361/58 |
| 6,013,598 A | | 1/2000 | Aytur | 307/109 |
| 6,023,406 A | | 2/2000 | Kinoshita et al. | 361/277 |
| 6,034,414 A | | 3/2000 | Lin | 257/600 |
| 6,037,650 A | | 3/2000 | Ioffe et al. | 257/596 |
| 6,111,423 A | * | 8/2000 | Imoto | 324/765 |
| 6,143,614 A | * | 11/2000 | Nasserbakht | 438/238 |

* cited by examiner

*Primary Examiner*—David Nelms
*Assistant Examiner*—Dae H. Nguyen
(74) *Attorney, Agent, or Firm*—Jacqueline J. Garner; W. James Brady, III; Frederick J. Telecky, Jr.

(57) ABSTRACT

A voltage controlled capacitor sandwiched between a buried oxide and a shallow trench insulator to form a near ideal P+ to n-well diode with minimal parasitic capacitance and resistance.

15 Claims, 6 Drawing Sheets

RF VOLTAGE CONTROLLED CAPACITOR ON THICK-FILM SOI

This application claims priority under 35 USC § 119(e)(1) of provisional application numbers 60/211,131 filed Jun. 13, 2000.

BACKGROUND AND SUMMARY OF THE INVENTION

The present invention relates to variable capacitors, specifically to p-n junction reverse bias voltage controlled capacitors.

BACKGROUND

VOLTAGE CONTROLLED CAPACITORS

Variable capacitors are used in many applications, including high frequency applications to tune oscillators, mixing circuits, multipliers, analog and digital phase shifter circuits, and for impedance matching and control in microwave IC applications. Voltage controlled capacitors (VCCs) are usually formed using reverse biased p-n junctions. The junction capacitance depends on the applied voltage and the design of the junction, including whether the junction is abrupt or graded. Carrier concentration difference between the p and n regions causes diffusion. This diffusion creates charge imbalance, which produces an electric field that tends to counteract the diffusion. In thermal equilibrium, the net flow of carriers is zero. The space charge region near the junction where mobile carrier concentrations have been reduced to below thermal equilibrium value is called the depletion or space charge region.

In typical voltage controlled capacitors the diodes are contained within well regions. FIG. 1 shows such capacitor. A positively doped region 102 exists within an n well region 104, which creates a diffusion layer 106 (the space charge region) between them. The depletion region is not planar in such a capacitor because of the configuration of the n and p regions. A built-in potential, $V_{bi}$, exists across the depletion region 106. This potential depends on the acceptor and donor impurity concentrations according to the following expression.

$$V_{bi} = \frac{Kt}{q} \ln\left(\frac{N_A N_D}{n_i^2}\right)$$

The width of the depletion region, $W_{SCR}$, depends on the built-in potential and varies with the applied voltage. $W_{SCR}$ is given by the following expression.

$$W_{SCR} = \left(\frac{2 K_s \epsilon_0 (V_{bi} - V_{App})(N_A + N_D)}{q(N_A N_D)}\right)^{1/2}$$

The width of the depletion region width also determines the junction capacitance.

$$C_J = \frac{K_s \epsilon_0 A}{W_{SCR}}$$

In these expressions, T is temperature, $K_s$ is the relative dielectric constant of the semiconductor (1.18 for silicon), epsilon naught is $8.854 \times 10^{31\ 14}$ farad/cm, k is Boltzmann's constant, $n_i$ is the intrinsic carrier concentration, $N_A$ is the acceptor impurity concentration, $N_D$ is the donor impurity concentration, and $V_{APP}$ is the applied voltage. FIG. 1 also shows P+ and N+ implants 108, 110 which serve as low resistance contacts.

Capacitive coupling between the well and the substrate and other stray capacitances cause parasitic capacitance in most VCCs. Parasitic capacitance limits high frequency operation and causes RF (radio-frequency) energy loss to the substrate. Triple well processes can eliminate some of these problems. However, in a triple well process the VCC parasitic capacitance to the well may change with bias since the depletion region is sensitive to total bias. This leads to added non-ideal VCC behavior. Also, three-terminal bias techniques are required to minimize capacitive coupling. Further, triple well processes add complexity and high cost to a bulk silicon process.

Some VCCs require the use of polysilicon VCC diodes for isolation improvement which usually have higher resistance and nonlinear behavior due to grain boundaries in the polysilicon.

It is therefore desirable to have a VCC circuit that has minima parasitic capacitance and resistance, more linear behavior than previous polysilicon diode capacitors, and that is easy to implement into standard processes.

Improved RF Voltage Controlled Capacitor on Thick-Film SOI

The present application discloses a VCC built within the thin film region between a buried oxide (BOX) and a shallow trench. This forms a near ideal diode with minimal parasitic capacitance and resistance.

In one class of embodiments, the VCC is formed on an integrated circuit using the SOI layer already present in a standard BiCMOS process. In the preferred embodiment, a PBL (p-doped buried layer) and an NBL (n-doped buried layer) form the lateral contacts of the VCC. The SOI layer is bounded on the bottom by a buried oxide layer. Shallow trench isolation covers the top of the active region of the VCC. Deep trench isolation bounds the contact regions and also bounds the active edge regions of the VCC for maximum device isolation.

Alternative embodiments include using n-well or p-well implants to form one or both ends of the diode instead of a buried layer. This minimizes the required area for the VCC. The doping of the VCC active region can be varied as well. For instance, the intrinsic doping of the thin film region can be used, or an additional mask step can be added to ion implant n-type or p-type dopants into the active region. Because of the lateral design of this VCC, a simple change in device layout allows the design of high voltage VCC structures with no changes in process. This is not obtainable for VCC designs using vertical device structures.

Though the preferred embodiment uses a P+ to n-well diode to form the capacitor, the innovations of the present application apply equally to N+ to p-well diodes for the VCC.

The presently disclosed teachings are also applicable to a VCC with an abrupt junction, or with graded junctions of various types within the diode.

The disclosed innovations, in various embodiments, provide one or more of at least the following advantages:
 low parasitic capacitance;
 low resistance;
 implementation into existing standard processes;
 linear voltage control response.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will e described with particular reference to the presently preferred embodiment (by way of example, and not of limitation).

The present application discloses using a thin film region sandwiched between a buried oxide and a shallow trench to form a near ideal P+ to n-well diode with minimal parasitic capacitance and resistance. The thin film SOI region is normally used only for the formation of the PBL and NBL of the SOI BiCMOS.

Figure 1:
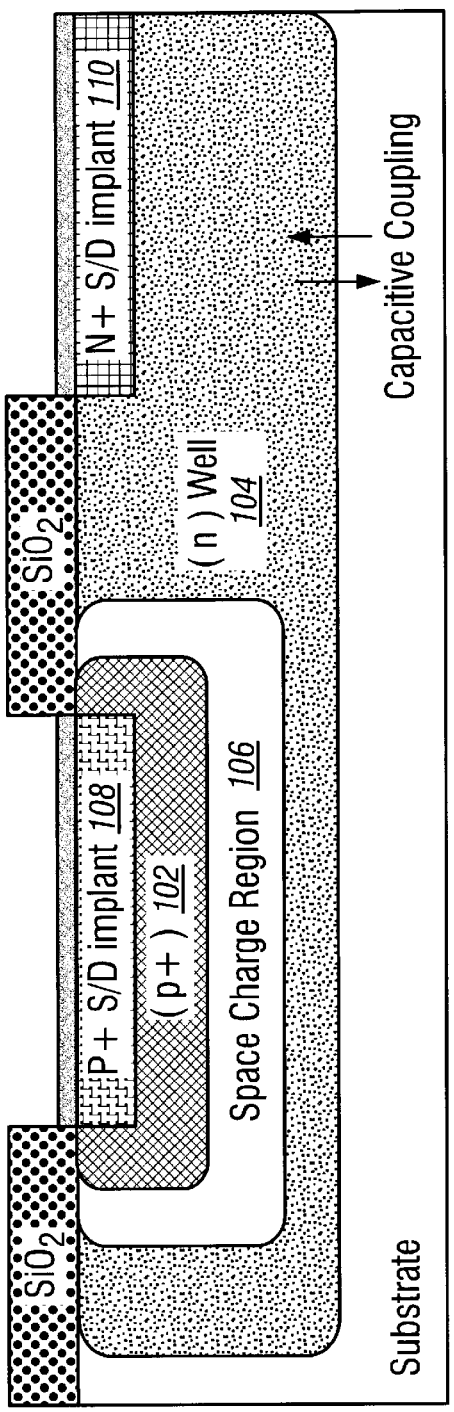
FIG. 1 shows a typical voltage controlled capacitor.
Figure 2:
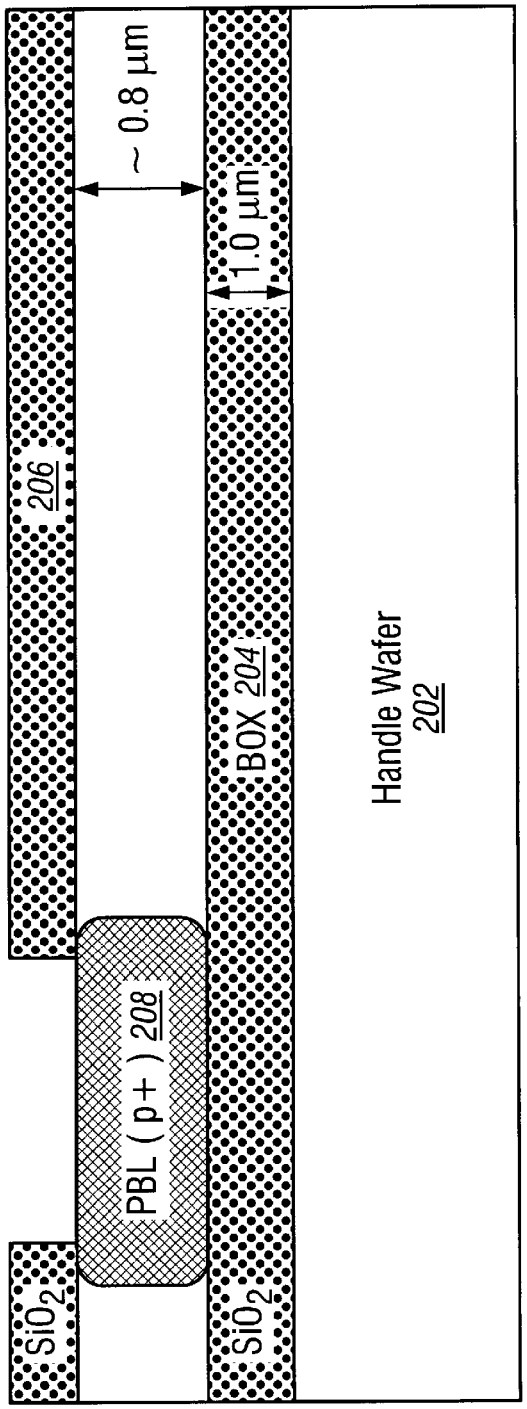
FIG. 2 shows an innovative VCC after implantation of the PBL.

Referring to FIG. 2, the process of the preferred embodiment is described. The process begins with a thick film SOI handle wafer 202 as a starting material. This handle wafer 202 is 1.25 $\mu$m thick. The handle wafer 202 may be a high resistance substrate to improve the Q of the capacitor. Also, the wafer 202 may be SOS (silicon on sapphire), SOG (silicon on glass), or SOA (silicon on anything) to achieve improved RF performance of the VCC. Next, a buried oxide (BOX) layer 204 is applied using known techniques. The BOX layer 204 is 1.0 $\mu$m thick.

Two thermal oxide masks are used for ion implant blocks and define the PBL and NBL layers. (FIG. 2 shows only the PBL layer 208. Please refer to FIG. 3 for both PBL and NBL layers.) First, mask one 206 is set and defines the PBL ion implant 208, which injects p+ into the silicon surface. FIG. 2 shows the process after this step.

Various dopants may be used for the p- and n-regions. For example, the n-dopants may be doped with As or Sb, while the p-region may be doped with Boron.

Figure 3:
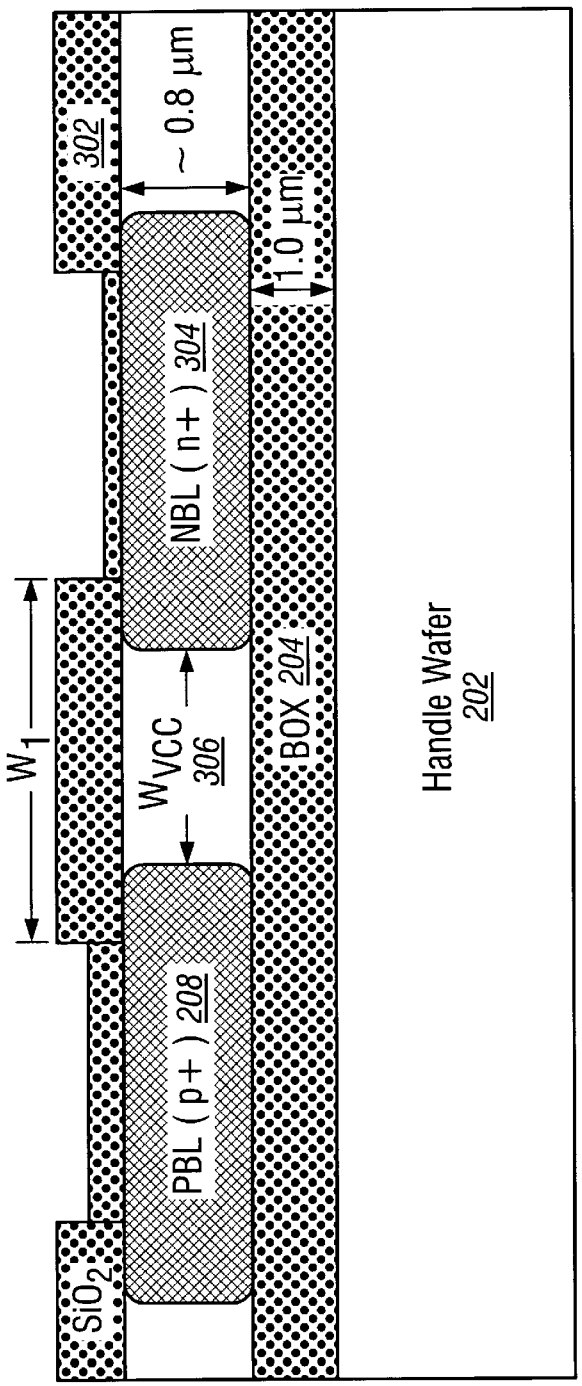
FIG. 3 shows an innovative VCC after implantation of the NBL.
Figure 5:
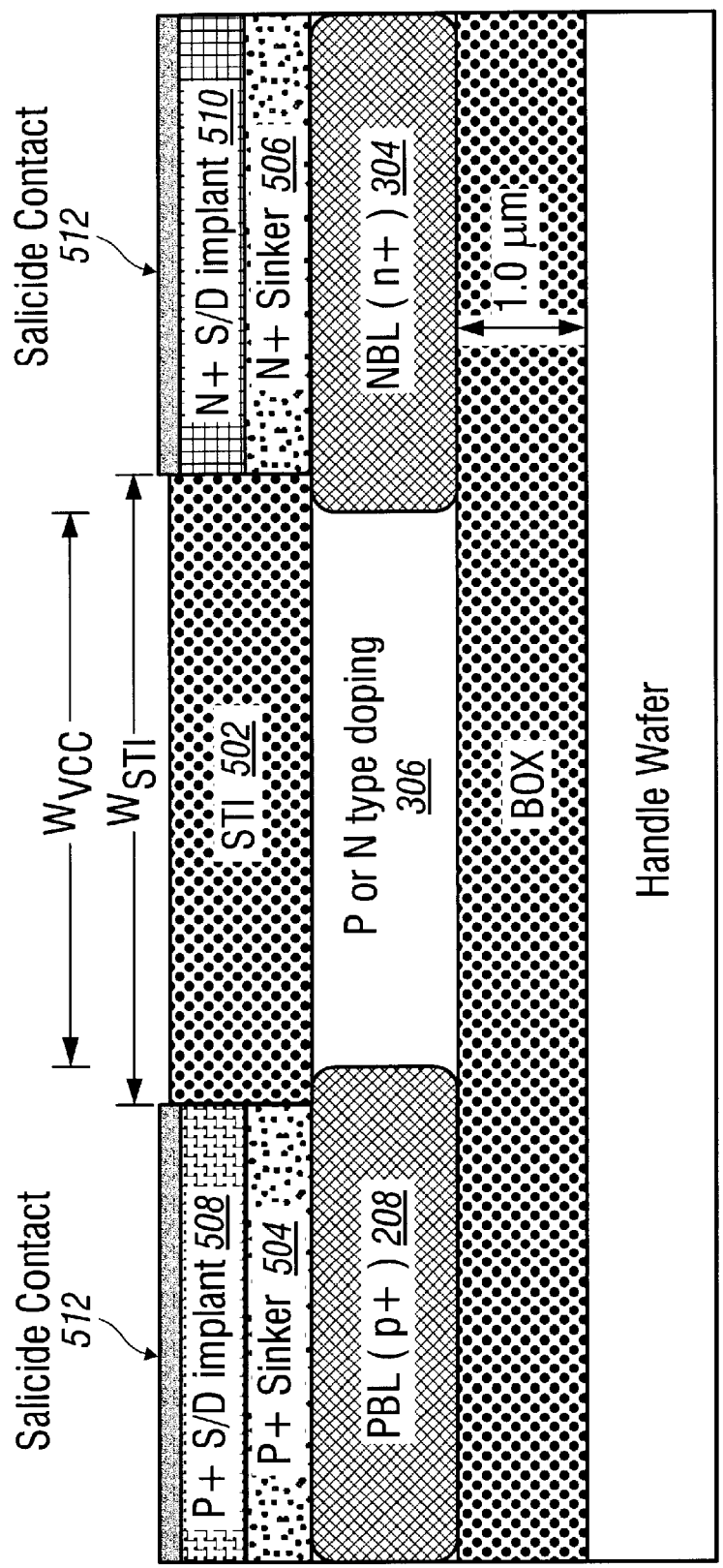
FIG. 5 shows the VCC after shallow trench isolation.

In FIG. 3, mask 2 302 defines the NBL (n+) ion implant 304. Once these areas are defined, the mask layer is removed, followed by a pre-epitaxial growth clean to prepare for further process steps. The VCC active region 306, $W_{VCC}$, is defined by the layout distance $W_t$ and the lateral diffusions of the PBL 208 and NBL 304 regions. In the preferred embodiment, the layout distance $W_t$ overlaps the PBL 208 and the NBL 304 regions this is in preparation for shallow trench isolation which covers the entire top of the active region, as shown in FIG. 5.

The PBL 208 and NBL 304 are used to form low resistance contacts to the VCC. An optional mask set, using ion implantation of n-type or p-type dopants, can be used to dope the region $W_{VCC}$ to any desired doping concentration. This allows for a wide range of design requirements to be fulfilled. To save this mask step, the intrinsic doping of the thin film p-epitaxial region 306 of the SOI wafer can be used.

Standard epitaxial growth techniques, used to form the collector of a BJT (bi-polar junction transistor), form an extended contact region of the VCC.

Figure 4:
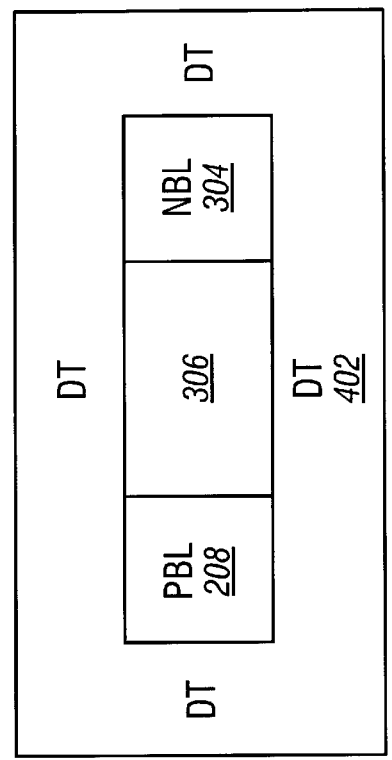
FIG. 4 shows a top view of the deep trench isolation.

Deep trench isolation is used along the periphery of the contact regions and along active edge regions of the VCC for maximum device isolation. FIG. 4 shows a the deep trench isolation from a top view. The PBL 208 and the NBL 304 regions are laterally bounded by deep trench isolation 402. The active region 306 is also bounded on both sides by deep trench isolation 402.

Referring now to FIG. 5, shallow trench isolation 502 (STI) covers the active region 306 of the VCC. The width $W_{STI}$ is set by the mask alignment and is governed by the $W_{VCC}$ requirements. The bottom of the STI 502 contacts the PBL 208 and NBL 304 to ensure a low parasitic VCC. Two additional mask steps are used to ion implant P+ 504 and N+ 506 sinkers to form low resistance contacts to the PBL 208 and NBL 304 layers. Next, three mask steps are used for the P+source-drain implants 508, N+ source-drain implants 510, and salicide contacts 512, which further reduce the total resistance of the VCC.

Figure 6:
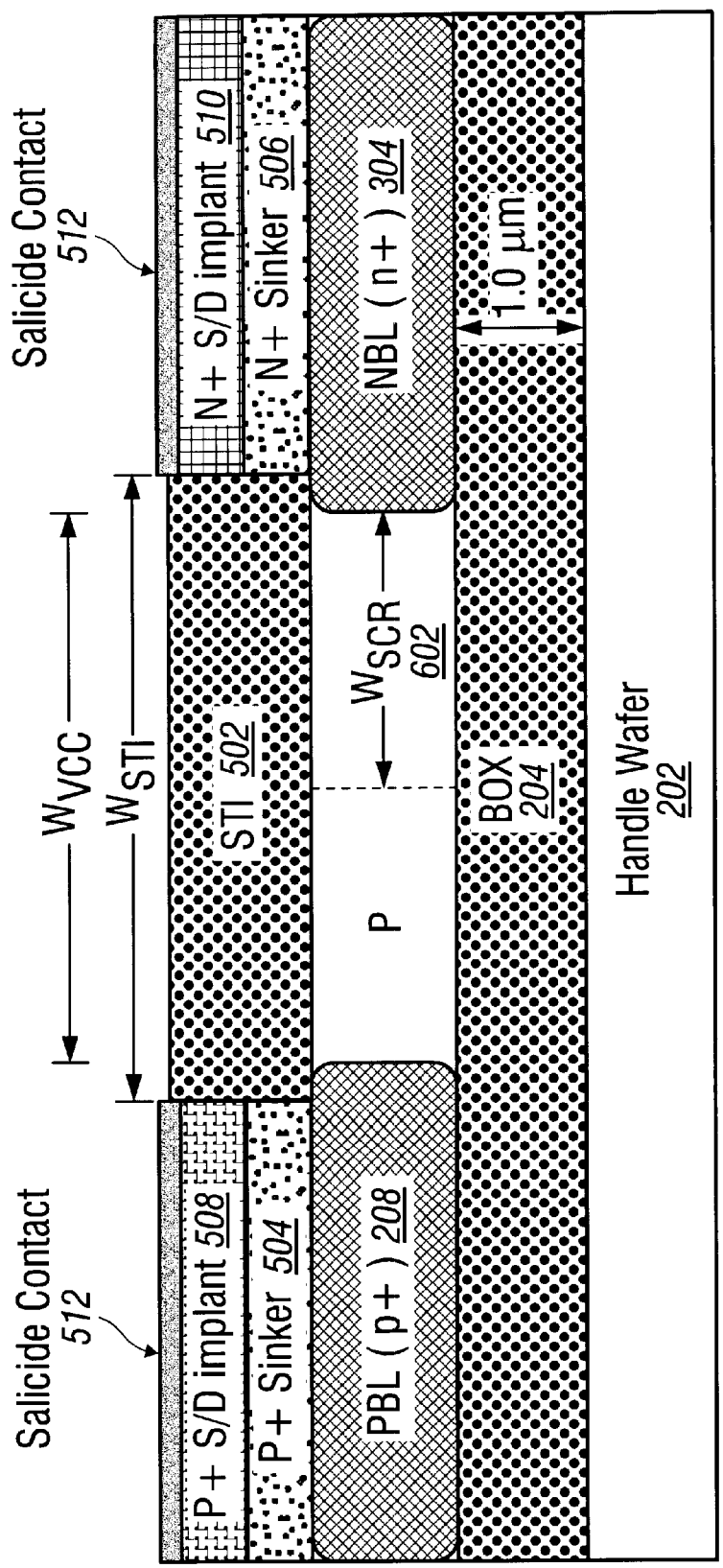
FIG. 6 shows the VCC with depletion region.

FIG. 6 shows the width of the depletion region 602, $W_{SCR}$, between the PBL 208 and NBL 304 layers. Because of the innovative use of the existing semiconductor region and the positioning of the doped end regions, the depletion region boundary is planar. FIG. 6 shows the completed process. The handle wafer 202 is covered by the BOX 204, which isolates the wafer 202 from the active region of the capacitor. The PBL 208 and the NBL 304 border the active region of the VCC to form low resistance contacts. P+ 504 and N+ 506 sinkers top the PBL 208 and NBL 304 layers to form low resistance contacts. The source drain implants 508, 510 and salicide contacts 512 complete the VCC and reduce total resistance. Standard BiCMOS process follows as normal resulting in a high performance low cost VCC.

It is expected that the P+ to N diode will form a better VCC since it is less susceptible to positive oxide trapped charge that may exist in the STI or BOX. However, the presently disclosed innovations are also applicable to building an N+ to P type diode for the VCC.

Figure 7:
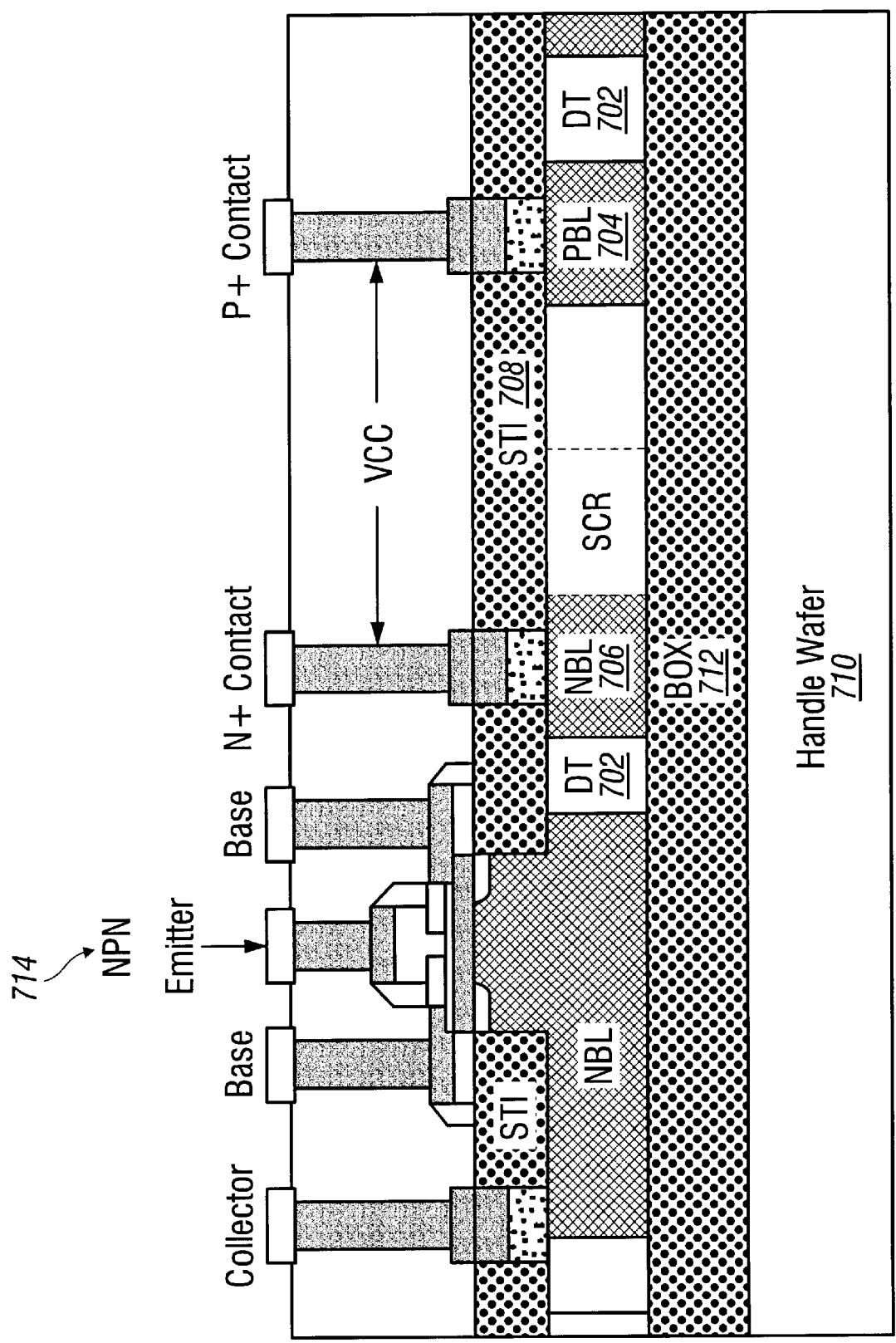
FIG. 7 shows the VCC integrated with a BJT.

FIG. 7 shows the integration of the VCC and NPN, and the dielectric isolation of the VCC from other components. A handle wafer 710 and BOX 712 provide a substrate. Deep trenches 702 exist along the outer edges of the PBL 704 and NBL 706 contact regions. In the preferred embodiment, the deep trenches 702 have width of 1.0 $\mu$m and depth of approximately 1.7 $\mu$m. The shallow trench isolation 708 depth is 0.6 $\mu$m. The NPN BJT 714 is also shown with emitter, base, and collector regions.

Figure 8:
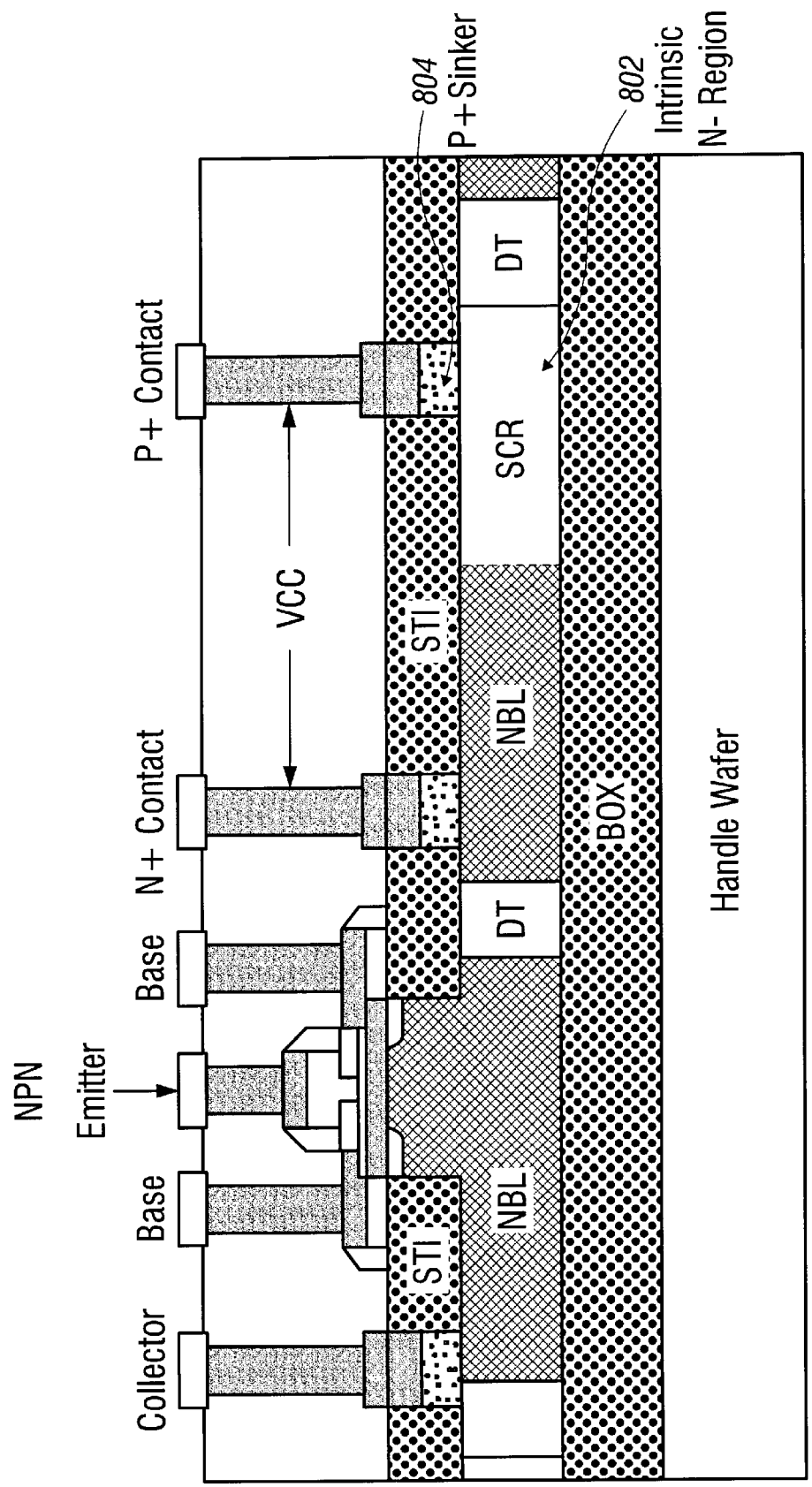
FIG. 8 shows an alternative embodiment without the PBL.

FIG. 8 shows another method of implementing the present innovations in an integrated NPN and VCC. In this method, there is no PBL layer, and the intrinsic N-region 802 is directly contacted by the P+ sinker 804 to form the contacts of the VCC. This has the advantage of minimizing the required area for the VCC.

Doping levels in the VCC should be as uniform as possible to get a linear response from the VCC. Diffusion graded VCCs may also be made using standard diffusion cycles.

This is the first solution to building a very low parasitic VCC with the thin film SOI region that is normally used for the formation of the PBL and NBL of a SOI BiCMOS technology. Most other techniques require the use of vertical diffusion isolated diodes or polysilicon diodes, which typically have higher resistance and more nonlinear behavior due to the grain boundaries in the polysilicon. The innovations disclosed in the present application may be used to achieve higher capacitance than isolated polysilicon diodes, primarily due to the reduced thickness. Thus, these present innovations may achieve the same VCC capacitance as a polysilicon diode but with greatly reduced area.

The disclosed innovative VCC design has many advantages over the prior art. The reduced leakage makes this design better for high temperature applications since leakage increases with temperature. The innovative design has greater resistance and better control of dopant diffusion compared to a polysilicon diode, since polysilicon experiences enhanced dopant diffusion. The greater diffusion of polysilicon also accounts for the smaller area of the innovative design, because the diffusion in polysilicon means that intrinsic capacitors require very large areas. The new design also allows an intrinsic VCC structure that is controllable in the lateral directions (which is not obtainable in polysilicon designs). Vertical structures are susceptible to leakage currents to the substrate, which also causes problems with high temperature performance. Finally, vertical structures are more susceptible to single event upset effects (such as alpha particle or gamma ray paths) because of their larger area. So the reduced area of the innovative design allows better performance in environments susceptible to such upset effects.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Bipolar Transistor: A type of transistor in which current flow between emitter and collector diffusions is controlled by current at a base diffusion.

CMOS: A circuit containing at least one NMOS and at least one PMOS transistor, or a chip containing at least one such circuit.

Contact Resistance: The resistance of a contact, or more generally the inverse of the conductance per unit area of a given contact interface. Units are ohms times area.

Current Leakage: Current leakage, or leakage current, is current that escapes from the device by means other than that intended, such as through parasitic bipolar action.

Depletion: Reduction of carrier density, in a volume of semiconductor material, due to applied voltage.

Diffusion: The process of diffusion is the spontaneous movement of dopant or impurity atoms through a semiconductor, at a rate which depends on temperature and on the particular elements involved. The noun "diffusion" usually refers to a doped portion of a semiconductor material.

Diode: A two-terminal device. Typically a diode is rectifying, i.e. passes current in only one direction. A rectifying diode may be implemented, for example, by a P-N junction in a semiconductor material.

Grain Boundary: An interface between separate grains in a polycrystalline material. The grain boundaries often have conduction and diffusion properties which are very different from those in the grains' interiors.

N-type: A volume of semiconductor which normally includes an excess of electrons. This can be achieved by introduction of "donor" dopants (such as phosphorus, arsenic, or antimony in silicon).

P-type: A volume of semiconductor which normally includes an excess of holes. This can be achieved by introduction of "acceptor" dopants (such as boron, indium, or gallium in silicon).

Semiconductor: A material which is less conductive than a metallic material, but more conductive than an insulator. (More precisely, a semiconductor will have a nonzero "bandgap" between its valence and conduction bands, which is no more than a few electron volts at the very most.) The most frequently used semiconductor material is silicon, but there are many others, including e.g. gallium arsenide (or "GaAs"), silicon-germanium, mercury cadmium telluride, indium phosphide, gallium-indium arsenide-phosphide, lead tin telluride, and silicon carbide. Wider-bandgap materials such as diamond and zinc sulfide are also sometimes classed as semiconductors.

SOI: Silicon on insulator device. These devices have a steeper sub-threshold slope than conventional bulk devices, thus reducing off-state current without increasing Vt.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Additional general background, which helps to show the knowledge of those skilled in the art regarding variations and implementations, may be found in the following publications, all of which are hereby incorporated by reference: VLSI TECHNOLOGY, S. M. Sze, McGraw-Hill, 1988; MICROELECTRONIC DEVICES, E. S. Yong, McGraw-Hill, 1988.

The dopants used to achieve the presently disclosed innovations may be varied over a wide range of materials, including those now known or yet to be discovered.

The present innovations may also be implemented into other standard processes for integrated circuits which can accommodate the innovative VCC.

The active region geometry might be made non-symmetric. For instance, the trench may be patterned to achieve a linear capacitance characteristic. Thickness from a side view or a top view of the VCC may be varied to create the asymmetry.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A voltage controlled capacitor, comprising:
   a semiconductor region having first and second doped ends, wherein said first doped end has opposite doping relative to said second doped end; and
   wherein said capacitor is overlaid with a shallow trench isolation, and underlaid by a buried oxide region.

2. The capacitor of claim 1, wherein said semiconductor region is a thin film.

3. The capacitor of claim 1, wherein said capacitor has planar depletion region boundaries.

4. The capacitor of claim 1, wherein said semiconductor is a crystalline semiconductor.

5. A voltage controlled capacitor circuit, comprising:
   a capacitor, said capacitor formed within an insulated semiconductor region;
   wherein said capacitor has planar depletion region boundaries whose position is determined by voltage bias.

6. The circuit of claim 5, wherein said depletion region is bounded by oppositely doped buried layers which form contacts for said capacitor.

7. The circuit of claim 5, wherein said depletion region is bounded on one end by a doped buried layer, and on the other end by a deep trench isolation.

8. The circuit of claim 5, wherein said semiconductor region is a thin film.

9. A voltage controlled capacitor, comprising:

a semiconductor region having a top, a bottom, first and second ends, and first and second sides;

wherein said bottom is bounded by a buried oxide; and wherein said top is bordered at least partially by shallow trench isolation.

10. The capacitor of claim 9, wherein said first end comprises a first doped buried layer; and wherein said second end comprises a second doped buried layer having opposite doping to said first doped buried layer.

11. The capacitor of claim 9, wherein said first end comprises a doped buried layer and is bounded by a deep trench isolation;

wherein said second end is bounded by a deep trench isolation; and wherein said top is contacted by a doped implant having opposite doping than said doped buried layer.

12. The capacitor of claim 9, wherein said shallow trench isolation extends at least from said first doped buried layer to said second doped buried layer.

13. The capacitor of claim 9, wherein said first and second sides are bounded by deep trench isolation.

14. The capacitor of claim 9, wherein said first and second ends are each bounded by deep trench isolation.

15. The capacitor of claim 9, wherein said first and second ends and said first and second sides are bounded by deep trench isolation.

* * * * *